United States Patent [19]

Kuesters et al.

[11] 4,054,682
[45] Oct. 18, 1977

[54] PHOTOPOLYMERIZABLE COMPOSITION CONTAINING A THIOETHER SENSITIZER

[75] Inventors: Werner Kuesters; Rolf Osterloh, both of Ludwigshafen; Manfred Jacobi, Frankenthal, all of Germany

[73] Assignee: BASF Aktiengesellschaft, Ludwigshafen, Germany

[21] Appl. No.: 757,382

[22] Filed: Jan. 6, 1977

[30] Foreign Application Priority Data

Jan. 23, 1976 Germany .................... 2602419

[51] Int. Cl.$^2$ ............... C08F 2/46; C08F 4/00
[52] U.S. Cl. ................. 427/54; 96/115 P; 204/159.15; 204/159.16; 204/159.18; 204/159.19; 204/159.24; 260/77.5 CR; 260/837 R; 428/417; 428/418; 428/425
[58] Field of Search ............ 204/159.18, 159.24; 96/115 P; 427/54

[56] References Cited

U.S. PATENT DOCUMENTS

| | | | |
|---|---|---|---|
| 3,720,635 | 3/1973 | Metzner et al. | 260/862 |
| 3,827,959 | 8/1974 | McGinniss | 204/159.24 |
| 3,849,497 | 11/1974 | Heine et al. | 260/591 |

*Primary Examiner*—Richard B. Turer
*Attorney, Agent, or Firm*—Keil, Thompson & Shurtleff

[57] ABSTRACT

A photopolymerizable composition containing olefinically unsaturated compounds, optional conventional additives and, as photoinitiator, a mixture of a thioether of the general formula (I):

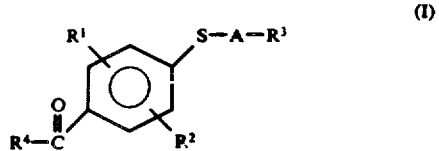

where
R$^4$ is phenyl, naphthyl, thienyl, furyl or styryl which may be substituted by one or more identical or different R$^5$'s,
R$^5$ is phenyl, benzoyl, halogen, alkyl of 1 to 5 carbon atoms, alkyl having an —O—group and 1 to 5 carbon atoms, alkyl having an —S—group and 1 to 5 carbon atoms, alkoxyalkyl of 2 to 5 carbon atoms, alkaryl of 7 to 11 carbon atoms, aralkyl of 7 to 11 carbon atoms, NO$_2$, CN, COOH or COOR$^6$, R$^6$ being an alkyl of 1 to 5 carbon atoms,
A is the alkylene group C$_n$H$_{2n}$ ($n$ = an integer of 1 to 5) which may be substituted by one or more R$^4$'s and/or R$^5$'s, and
R$^1$, R$^2$ and R$^3$ may be identical or different and are each H, an R$^4$ or an R$^5$, and an organic amine.

The photopolymerizable composition is suitable for the production of coatings and printing inks which can be cured by ultraviolet radiation.

15 Claims, No Drawings

PHOTOPOLYMERIZABLE COMPOSITION CONTAINING A THIOETHER SENSITIZER

The present invention relates to a photopolymerizable composition containing a photoinitiator, and to the use thereof for the production of coatings, printing inks and photopolymer printing plates which can be cured by ultraviolet radiation.

Mixtures of olefinically unsaturated compounds, commonly used additives and photoinitiators which can be polymerized by ultraviolet radiation are known and are used in industry for example for the production of coatings and photopolymer printing plates. A large number of photoinitiators have been proposed in the patent literature and some of these have already been industrially employed, e.g. azo, diazo and diazonium compounds, α-diketones and their derivatives, acyloins and their derivatives, aromatic disulfides, and aromatic carbonyl compounds containing halogen or sulfur. However, industrial utilization of the proposed photoinitiators is restricted by a number of disadvantages. For example, most initiators are not reactive enough for many purposes, particularly when photopolymerization is to be carried out in the presence of atmospheric oxygen. Some initiators are only extremely difficultly soluble at room temperature in the compounds to be polymerized or result in distinct yellowing during curing of the photopolymerizable composition, which is a big disadvantage for example in the production of coatings.

Although the combination of chlorothioxanthone and methyldiethanolamine according to U.S. Pat. No. 3,759,807 or the combination of benzophenone and Michler's ketone according to German Laid-Open Application (DOS) 2,216,154 makes possible the rapid curing, by ultraviolet radiation, of coating compositions containing photopolymerizable compounds, the cured coatings are distinctly yellow in color. Moreover, chlorothioxanthone is difficultly soluble in the mixture to be polymerized, and relatively thick coatings cannot be adequately cured all the way through when Michler's ketone is employed. Photopolymerizable compositions which contain an aromatic carbonyl compound such as diethoxyacetophenone (German Laid-Open Application (DOS) 2,261,383) or 2-phenylthioacetophenone (U.S. Pat. No. 3,720,635) do not have a tendency to yellow, but their reactivity is relatively low, so that they are hardly suitable for applications where a high curing rate is absolutely necessary. Although most of the said disadvantages can be avoided by using benzoyl derivatives of diphenyl sulfide, as proposed in German Laid-Open Application (DOS) No. 2,504,335, these compounds can only be manufactured with difficulty on a commercial scale.

It is therefore an object of the invention to provide photoinitiator-containing photopolymerizable compositions which are highly reactive and which do not yellow at all or only slightly when exposed to ultraviolet radiation. A further object of the invention is to provide photoinitiators which can be easily synthesized and which are readily soluble at room temperature in the compounds to be polymerized.

We have found that these objects are achieved with a photopolymerizable composition which contains olefinically unsaturated compounds, optional conventional additives and 0.2 to 20% by weight, based on the unsaturated compounds, of a photoinitiator, the photoinitiator being a mixture of A. A thioether of the general formula (I)

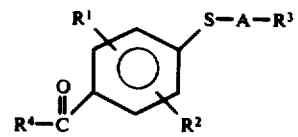

where
R⁴ is phenyl, naphthyl, thienyl, furyl or styryl which may be substituted by one or more identical or different R⁵'s, R⁵ is phenyl, benzoyl, halogen, alkyl of 1 to 5 carbon atoms, alkyl having an —O— group and 1 to 5 carbon atoms, alkyl having an —S— group and 1 to 5 carbon atoms, alkoxyalkyl of 2 to 5 carbon atoms, alkaryl of 7 to 11 carbon atoms, aralkyl of 7 to 11 carbon atoms, $NO_2$, CN, COOH or COOR⁶, R⁶ being an alkyl of 1 to 5 carbon atoms.

A is the alkylene group $C_nH_{2n}$ ($n$ = an integer of 1 to 5) which may be substituted by one or more R⁴'s and/or R⁵'s, and R¹, R² and R³ may be identical or different and are each H, an R⁴ or an R⁵, and B. an organic amine.

Suitable olefinically unsaturated compounds are all photopolymerizable organic compounds which contain at least one carbon-carbon double bond, namely both low molecular weight and high molecular weight compounds. Mixtures of various unsaturated compounds can of course also be used; to control the viscosity of the photopolymerizable composition, it is advantageous to mix a more viscous high molecular weight unsaturated compound with one or more low molecular weight compounds.

Examples of suitable low molecular weight photopolymerizable compounds are: hydrocarbon compounds such as olefins, styrene and vinyl toluene; acrylyl and methacrylyl compounds such as acrylic acid and methacrylic acid, the esters thereof with monohydric alkanols of 1 to 20 carbon atoms, the monoesters, diesters, triesters and tetraesters thereof with dihydric, trihydric or tetrahydric alkanols of 2 to 20 carbons, and the nitriles, amides and N-methylolamides thereof; vinyl compounds such as vinyl chloride, vinylidene chloride, vinyl esters, vinyl ketones, vinyl sulfones, N-vinyl pyrrolidone and N,N'-divinyl ureas;

Examples of suitable high molecular weight photopolymerizable compounds are:

unsaturated polyesters having a molecular weight of from 500 to 5000 and manufactured from α,β-unsaturated dicarboxylic acids, such as maleic acid, fumaric acid and itaconic acid, which can be partially replaced by saturated dicarboxylic acids, such as adipic acid, phthalic acid and terephthalic acid, alkanediols, such as ethylene glycol, propylene glycol, butanediol, neopentyl glycol and alkoxylated bisphenol A, and, if desired, polyhydric alcohols and/or carboxylic acids; epoxy acrylates having a molecular weight of from 200 to 1500 and manufactured by reaction of acrylic or methacrylic acid with aromatic or aliphatic diglycidyl ethers, e.g. those based on bisphenol A, butanediol, pentaerythritol or neopentyl glycol, or with epoxidized polybutadienes or linseed oils;

urethane acrylates having a molecular weight of from 200 to 4000 and manufactured by reaction of hydroxyalkyl acrylates, such as hydroxyethyl acrylate, hydroxyethyl methacrylate, hydroxypropyl acrylate, hydroxypropyl methacrylate, butanediol monoacrylate and butanediol monomethacrylate, with polyisocyanates, preferably with aliphatic or cycloaliphatic diisocyanates, such as hexamethylene diisocyanate and isophorone diisocyanate, and, if desired, polyols, such as hydroxyl-containing polyacrylates and polyesters;

polyester acrylates manufactured by reacting hydroxyl-containing saturated polyesters with acrylic or methacrylic acid; unsaturated aminoplast resins manufactured by reaction of optionally etherified aminoplasts, such as melamine-formaldehyde and urea-formaldehyde condensation products, with hydroxyalkyl acrylates; and butadiene polymers, vinyl urethanes and diallyl phthalate prepolymers.

Mixtures of unsaturated polyesters, epoxy acrylates or urethane acrylates with low molecular weight acrylates are particularly preferred.

The photopolymerizable composition according to the invention contains 0.2 to 20%, preferably 0.5 to 10%, by weight, based on the unsaturated compounds, of a photoinitiator which is a mixture of a thioether and an organic amine.

The thioethers have the above formula and can usually be manufactured from the appropriate components by Friedel Crafts acylation; this reaction is described for example by G. A. Olag in "Friedel Crafts and Related Reactions", Volumes I and III, Interscience, New York, 1963. Examples of suitable thioethers are:
(4-methylthio)-benzophenone,
β-(p-methylthiobenzoyl)-naphthalene,
α-(p-methylthiobenzoyl)-naphthalene,
2-(p-methylthiobenzoyl)-thiophene,
3-(p-methylthiobenzoyl)-thiophene,
2-(p-methylthiobenzoyl)-furan,
3-(p-methylthiobenzoyl)-furan,
2-methyl-(4'-methylthio)-benzophenone,
2,4-dimethyl-(4'-methylthio)-benzophenone,
2,4,6-trimethyl-(4'-methylthio)-benzophenone,
4-methoxy-(4'-methylthio)-benzophenone,
4,4'-bis-(methylthio)-benzophenone,
2,4'-bis-(methylthio)-benzophenone,
2-phenyl-(4'methylthio)-benzophenone,
2-chloro-(4'methylthio)-benzophenone,
2-fluoro-(4'-methylthio)-benzophenone,
2-bromo-(4'methylthio)-benzophenone,
2-iodo-(4'-methylthio)-benzophenone,
2,4-dichloro-(4'-methylthio)-benzophenone,
4-trifluoromethyl-(4'-methylthio)-benzophenone,
2-trifluoromethyl-(4'-methylthio)-benzophenone,
4-trichloromethyl-(4'-methylthio)-benzophenone,
2-trichloromethyl-(4'-methylthio)-benzophenone,
2-chloro-4-nitro-(4'-methylthio)-benzophenone,
3-nitro-(4'-methylthio)-benzophenone,
2-benzyl-(4'-methylthio)-benzophenone,
2-carboxy-(4'-methylthio)-benzophenone,
2-carbomethoxy-(4'-methylthio)-benzophenone,
4-cyano-(4'-methylthio)-benzophenone,
3-methyl-(4'-methylthio)-benzophenone,
2-methyl-(4'methylthio)-benzophenone,
2-methyl-(4'-ethylthio)-benzophenone,
2-methyl-(4'-benzylthio)-benzophenone,
2,4-dimethyl-(4'-α-phenethylthio)-benzophenone,
2-chloro-(4'-phenethylthio)-benzophenone,
4-methyl-(4'-β-ethoxyethylthio)-benzophenone, and
2,4-dichloro-2',6'-dimethyl-(4'-chloromethylthio)-benzophenone.

2-methyl-(4'-methylthio)-benzophenone, 2,4-dimethyl-(4'-methylthio)-benzophenone, 4,4'-bis-(methylthio)-benzophenone, (4-methylthio)-benzophenone and 2-fluoro-(4'-methylthio)-benzophenone are particularly preferred.

The organic amines act as activators for the photoinitiator in the polymerization. All primary, secondary or tertiary amines are suitable; they may be aliphatic, aromatic or heterocyclic. Suitable are amines of the general formula:

where R', R'', R''' and R'''' each denote any organic radical. A detailed list of suitable amines is given in U.S. Pat. No. 3,759,807. Tertiary amines, particularly those containing hydroxyl groups, are preferred. Morpholine, diethanolamine, triethanolamine, methyldiethanolamine and dimethylethanolamine for instance are particularly suitable.

The weight ratio of component A to component B is advantageously from 9:1 to 1:9.

The photopolymerizable compositions may contain, in addition to the polymerizable compounds and the photoinitiator, conventional additives in the usual amounts, e.g. inorganic or organic pigments or dyes, inorganic or organic fillers, polymerization inhibitors such as hydroquinone and tert-butyl hydroquinone, antiskinning agents such as paraffin wax, flow modifiers such as silicone oil, flatting agents or lubricants such as waxes, and organic solvents such as alcohols, hydrocarbons and ketones.

Light having a wavelength of from 2300 to 4500 A, particularly light whose emission maximum is between 3000 to 4100 A, is used to initiate the photopolymerization. Suitable sources of radiation are mercury vapor lamps and superactinic fluorescent tubes.

The compositions of the invention are suitable for the production of coatings, particularly coatings having a thickness of from 8 to 200 μm, on any kind of substrate, e.g. metal, wood, plastics material, paper and cardboard. The coatings can be used as protective coatings or for decorative purposes.

The compositions are also suitable for the production of ultraviolet-cure printing inks and pastes for printing sheet metal, paper and plastics film and sheeting, the thickness of the applied layer being from 0.5 to 5 μm. Finally, they can also be used to manufacture photopolymer printing plates, particularly relief printing plates, and photoresists.

The parts and percentages given in the following Examples are by weight.

EXAMPLE 1

A clear coating composition was prepared from a mixture of olefinically unsaturated esters. This mixture consisted of 65% of the reaction product of bisphenol A diglycidyl ether and acrylic acid, and 35% of butanediol diacrylate. This mixture was split up into portions and 3% of each of the following photoinitiators and 3% of methyldiethanolamine were added to each portion:
a. benzophenone,
b. 2-methylthioxanthone (because of its poor solubility only 1%),
c. 2-methylthiobenzophenone, d. 2-methylthio-2',5'-dimethylbenzophenone,
e. 2-methylthio-2',4'-dimethylbenzophenone,
f. 2-methylthio-2',4',6'-trimethylbenzophenone,
g. 2-methylthio-2'-hydroxy-5'-methylbenzophenone,
h. 4-methylthiobenzophenone,
i. 2-methyl-4'-methylthiobenzophenone,
k. 4,4'-bis-(methylthio)-benzophenone,
l. 4-methylthio-2',4',6'-trimethylbenzophenone,
m. 2-chloro-4'-methylthiobenzophenone, and
n. 2-fluoro-4'-methylthiobenzophenone.

Compositions (h) to (n) are in accordance with the present invention.

The resulting clear coatings were applied to degreased sheets of glass with a doctor to give 50 μm thick films which were irradiated with a high pressure mercury lamp (power: 80 watts/cm arc length), the distance between the lamp and film being 10 cm in each case. The exposure time was adjusted by means of a conveyor belt capable of infinite speed variation on which the coated sheets of glass were passed beneath the ultraviolet lamp.

The conveyor belt speed (in m/min) was determined at which a coating was obtained which was just scratch-resistant. The expression "scratch-resistant" means that no break in the surface of the film is produced by vigorous rubbing with a fingernail. The results obtained are given in the following Table:

TABLE

| Experiment | Conveyor belt speed (m/min) | Yellowing |
| --- | --- | --- |
| (a) | 16 | — |
| (b) | 53 | distinct |
| (c) | 11 | no |
| (d) | 11 | " |
| (e) | 11 | " |
| (f) | 11 | " |
| (g) | 11 | " |
| (h) | 53 | slight |
| (i) | 53 | no |
| (k) | 38 | slight |
| (l) | 30 | " |
| (m) | 30 | " |
| (n) | 38 | " |

EXAMPLE 2

60 parts of the reaction product of 2 moles of hydroxypropyl acrylate and 1 mole of isophorone diisocyanate was dissolved in 40 parts of pentanediol diacrylate. 30 parts of titanium dioxide was dispersed in this mixture in the course of 4 hours. 3 g of methyl diethanolamine and 3 g of 2-methyl-(4'methylthio)-benzophenone were dissolved in 100 g of this white coating material. The resulting coating was applied to degreased tinplate with a doctor to give a 15 μm thick film which was cured as described in Example 1. At a conveyor belt speed of 16 m/min there was obtained a scratch-resistant, non-yellowed coating.

We claim:

1. A photopolymerizable composition containing olefinically unsaturated compounds and 0.2 to 20% by weight, based on the unsaturated compounds, of a photoinitiator, wherein the photoinitiator is a mixture of
A. a thioether of the general formula (I):

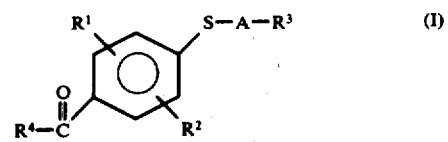

where
R$^4$ is phenyl, naphthyl, thienyl, furyl or styryl which may be substituted by one or more identical or different R$^5$'s,
R$^5$ is phenyl, benzoyl, halogen, alkyl of 1 to 5 carbon atoms, alkyl having an —O—group and 1 to 5 carbon atoms, alkyl having an —S—group and 1 to 5 carbon atoms, alkoxyalkyl of 2 to 5 carbon atoms, alkaryl of 7 to 11 carbon atoms, aralkyl of 7 to 11 carbon atoms, NO$_2$, CN, COOH or COOR$^6$, R$^6$ being an alkyl of 1 to 5 carbon atoms,
A is the alkylene group C$_n$H$_{2n}$ ($n$ = an integer of 1 to 5) which may be substituted by one or more R$^4$'s and/or R$^5$'s, and
R$^1$, R$^2$ and R$^3$ may be identical or different and are each H, an R$^4$ or an R$^5$,
and
B. an organic amine.

2. A photopolymerizable composition as claimed in claim 1 which additionally contains conventional additives.

3. A photopolymerizable composition as claimed in claim 1, wherein the olefinically unsaturated compound is at least one low molecular weight compound selected from the group consisting of styrene, an acrylyl compound, a methacrylyl compound and a vinyl compound.

4. A photopolymerizable composition as claimed in claim 1, wherein the olefinically unsaturated compound is at least one substance selected from the group consisting of an unsaturated polyester, an epoxy acrylate and a urethane acrylate.

5. A photopolymerizable composition as claimed in claim 1, wherein the olefinically unsaturated compounds are a mixture of at least one of the low molecular weight compounds according to claim 3 and at least one of the high molecular weight compounds according to claim 4.

6. A photopolymerizable composition as claimed in claim 1, wherein at least one compound selected from the group consisting of 2-methyl-(4'-methylthio)-benzophenone, 2,4-dimethyl-(4'-methylthio)-benzophenone, 4,4'-bis-(methylthio)-benzophenone, (4-methylthio)-benzophenone and 2-fluoro-(4'-methylthio)-benzophenone is used as organic thioether.

7. A photopolymerizable composition as claimed in claim 1, wherein amines are used which have the general formula:

where R', R'', R''' and R'''' each denote any organic radical.

8. A photopolymerizable composition as claimed in claim 1, wherein tertiary amines, particularly hydroxyl-containing tertiary amines, are used as amines.

9. A photopolymerizable composition as claimed in claim 1, wherein the weight ratio of component A to component B is from 9:1 to 1:9.

10. A process for the production of coatings, wherein a photopolymerizable composition as claimed in claim 1 is applied to the substrate to be coated and cured by means of light having a wavelength of from 2300 to 4500 A.

11. A process for the production of coatings, wherein a photopolymerizable composition as claimed in claim 2 is applied to the substrate to be coated and cured by means of light having a wavelength of from 2300 to 4500 A.

12. A process for the production of photopolymer printing plates, wherein there is used a photopolymerizable composition as claimed in claim 1.

13. A process for the production of photopolymer printing plates, wherein there is used a photopolymerizable composition as claimed in claim 2.

14. A process for the production of ultraviolet-cure printing inks, wherein a photopolymerizable composition as claimed in claim 1 is used as printing ink binder.

15. A process for the production of ultraviolet-cure printing inks, wherein a photopolymerizable composition as claimed in claim 2 is used as printing ink binder.

* * * * *